(12) United States Patent
Tokuda

(10) Patent No.: US 11,917,748 B2
(45) Date of Patent: Feb. 27, 2024

(54) ELECTRIC WIRING MEMBER AND LIQUID EJECTION HEAD

(71) Applicant: CANON KABUSHIKI KAISHA, Tokyo (JP)

(72) Inventor: Takamitsu Tokuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 17/696,527

(22) Filed: Mar. 16, 2022

(65) Prior Publication Data

US 2022/0304141 A1  Sep. 22, 2022

(30) Foreign Application Priority Data

Mar. 18, 2021  (JP) .................. 2021-044421

(51) Int. Cl.
*H05K 1/02* (2006.01)
*B41J 2/14* (2006.01)
*H05B 3/56* (2006.01)

(52) U.S. Cl.
CPC ........ *H05K 1/0212* (2013.01); *B41J 2/14072* (2013.01); *B41J 2/14112* (2013.01); *H05B 3/56* (2013.01); *H05K 1/0298* (2013.01)

(58) Field of Classification Search
CPC .... H05K 1/0212; H05K 1/0298; H05K 1/118; H05K 1/167; H05K 1/189; B41J 2/14072; B41J 2/14112; B41J 2002/14491; B41J 2/04528; B41J 2/04563; B41J 2/04586; H05B 3/56; H05B 3/34
See application file for complete search history.

(56) References Cited

U.S. PATENT DOCUMENTS

| 9,931,840 | B2 | 4/2018 | Douglass | |
|---|---|---|---|---|
| 10,328,691 | B2 | 6/2019 | Douglass | |
| 2012/0007908 | A1* | 1/2012 | Masuda | ................. B41J 2/0458 347/17 |
| 2015/0054878 | A1 | 2/2015 | Douglass | |
| 2018/0170041 | A1 | 6/2018 | Douglass | |

FOREIGN PATENT DOCUMENTS

JP  6514457 B2  5/2019

* cited by examiner

*Primary Examiner* — Bradley W Thies
(74) *Attorney, Agent, or Firm* — Canon U.S.A., Inc. IP Division

(57) ABSTRACT

Provided is an electric wiring member supported by a support member that supports a recording element substrate configured to eject a liquid. The electric wiring member has a signal line for transmitting a drive signal used for driving the recording element substrate, a power line for supplying drive power to the recording element substrate, and a heat generating resistive line for heating the support member. The power line is arranged between the signal line and the heat generating resistive line.

20 Claims, 13 Drawing Sheets

ELECTRIC WIRING MEMBER AND LIQUID EJECTION HEAD

BACKGROUND

Field

The present disclosure relates to an electric wiring member such as a flexible wiring board and a liquid ejection head including the electric wiring member.

Description of the Related Art

A liquid ejection head has a flexible wiring board, a recording element substrate having an ejection port that ejects a liquid such as ink, and a support member that supports the recording element substrate. The recording element substrate is electrically connected to the flexible wiring board. A drive signal and drive power are supplied to the recording element substrate via a flexible wiring board.

The support member includes a flow path used for supplying a liquid to the recording element substrate and a flow path used for discharging a liquid that has passed through the inside of the recording element substrate and is configured to circulate the liquid through these flow paths.

The liquid is heated inside the recording element substrate. Thus, the temperature of a liquid flowing in the flow path on the discharge side is higher than the temperature of a liquid flowing in the flow path on the supply side.

Japanese Patent No. 6514457 discloses a flexible circuit embedded in a print head. This flexible circuit is used instead of a thermistor and has a first layer having a resistive heat source and a second layer having a temperature sensing element.

SUMMARY

An electric wiring member of the present disclosure is an electric wiring member supported by a support member that supports a recording element substrate configured to eject a liquid. The electric wiring member has a signal line for transmitting a drive signal used for driving the recording element substrate, a power line for supplying drive power to the recording element substrate, and a heat generating resistive line for heating the support member. The power line is arranged between the signal line and the heat generating resistive line.

Further features of the present disclosure will become apparent from the following description of exemplary embodiments with reference to the attached drawings.

DESCRIPTION OF THE EMBODIMENTS

In the liquid ejection head described above, the flow path on the supply side and the flow path on the discharge side have different temperatures and this results in an uneven temperature distribution in the support member, and this may cause deformation due to a thermal stress at a site where a temperature difference occurs.

With use of the flexible circuit disclosed in Japanese Patent No. 6514457, it is possible to suppress the temperature distribution of the support member from being uneven. However, since the flexible wiring board is in contact with the support member, there is a spatial constraint. It is thus difficult to newly provide a flexible circuit that requires a space for arrangement in addition to the flexible wiring board. Further, such addition of a new flexible circuit results in an increase in manufacturing cost.

The present disclosure intends to suppress an uneven temperature distribution of a support member without adding a new member that requires a space for arrangement.

Embodiments of the present disclosure will be described below in detail with reference to the drawings. However, components or combinations of elements described in the embodiments are mere examples and are not intended to limit the scope of the present disclosure thereto.

First Embodiment

Figure 1:
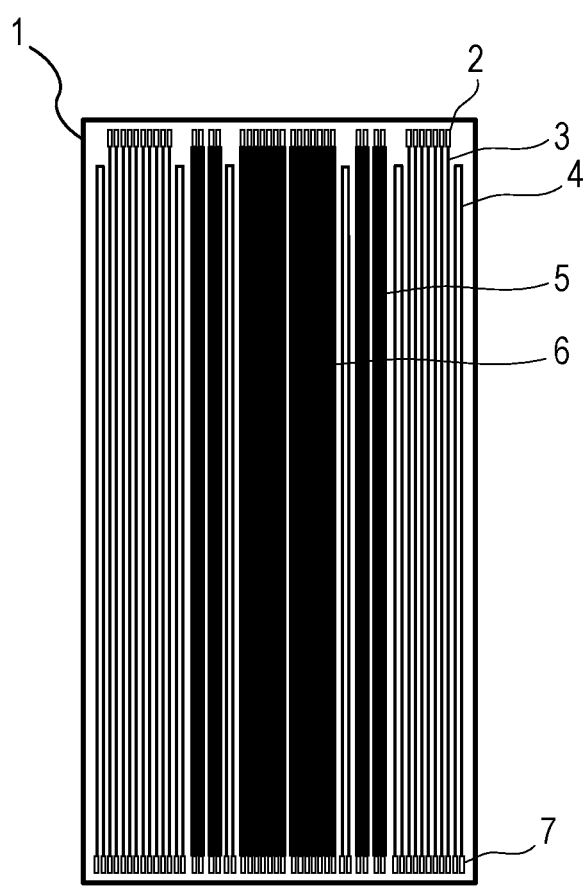
FIG. 1 is a schematic diagram illustrating a configuration of a flexible wiring board according to a first embodiment of the present disclosure.

FIG. 1 is a schematic diagram illustrating a configuration of a flexible wiring board according to a first embodiment of the present disclosure. A flexible wiring board 1 is an example of the electric wiring member of the present disclosure. The flexible wiring board 1 is electrically connected to a recording element substrate (not illustrated) that ejects a liquid such as ink and supported by a holding member (not illustrated) that holds the recording element substrate. The flexible wiring board 1 is a so-called flexible printed wiring board. The flexible wiring board 1, the recording element substrate, and the support member are elements forming a liquid ejection head.

As illustrated in FIG. 1, the flexible wiring board 1 has pads 2 and 7, signal lines 3, heat generating resistive lines 4, power lines 5, and power lines 6. Each signal line 3 transmits a drive signal used for driving the recording element substrate. Each of the power lines 5 and the power lines 6 is for supplying drive power to the recording element substrate. For example, the power line 5 is used for supplying power to a drive circuit of recording elements, and the power line 6 is used for supplying power to the recording elements. The width (or the sectional area) of the power line 5 is smaller than the width (or the sectional area) of the power line 6. Each heat generating resistive line 4 is for heating the holding member. The width (or the sectional area) of the heat generating resistive line 4 is smaller than the width (or the sectional area) of the power line 5.

A plurality of signal lines 3, a plurality of heat generating resistive lines 4, a plurality of power lines 5, and a plurality of power lines 6 are provided together. In this example, two power lines 6 are arranged in the center. The power lines 5 are arranged on both sides of the region of the power lines 6, and the signal lines 3 are further arranged outside the power lines 5. The heat generating resistive lines 4 are arranged between the signal line 3 and the power line 5 and between the power line 5 and the power line 6, respectively. Furthermore, the heat generating resistive lines 4 are arranged outside the signal lines 3. That is, a plurality of heat generating resistive lines 4 are arranged in parallel in the width direction of the flexible wiring board 1 and configured to be able to heat themselves over the extent of the width direction of the flexible wiring board 1.

The thickness or the width of the heat generating resistive line 4 is determined based on a result obtained by measuring a rise in temperature while changing the thickness or the width and a current value of a conductor. For example, when current of 3 A is conducted in the heat generating resistive line 4 having a conductor thickness of 35 μm and a conductor width of 2 mm, the temperature rises by about 10 degrees Celsius. When the conductor width is changed from 2 mm to 1 mm with the same conductor thickness and current value as above, the temperature rises by about 20 degrees Celsius. When the conductor width is 0.2 mm and the current value is 1 A with the same conductor thickness as above, the temperature rises by about 30 degrees Celsius. Based on these results, the thickness or the width of the heat generating resistive line 4 is determined so that a desired rise in temperature can be obtained.

Note that, when a temperature rise curve is given as resistance data in advance, the thickness or the width of the heat generating resistive line 4 may be determined based on the temperature rise curve.

A plurality of pads 7 are provided to one of both ends of the flexible wiring board 1, and a plurality of pads 2 are provided to the other. Each pad 7 is electrically connected to the main unit of the recording apparatus on which the liquid ejection head is mounted. Each pad 2 is electrically connected to the recording element substrate. The signal line 3, the heat generating resistive line 4, the power line 5, and the power line 6 are electrically connected to the main unit of the recording apparatus via different pads 7, respectively. The signal line 3, the power line 5, and the power line 6 are electrically connected to the recording element substrate via different pads 2, respectively. Drive power is supplied to the recording element substrate via the pad 7, the power line 5 or the power line 6, and the pad 2. A drive signal is supplied to the recording element substrate via the pad 7, the signal line 3, and the pad 2.

Both ends of the heat generating resistive line 4 are electrically connected to the pad 7, respectively. In this example, two adjacent pads 7 are used for one heat generating resistive line 4. The heat generating resistive line 4 extends from one of the pads 7 toward the pad 2, folds back before reaching the pad 2, and extends to the other of the pads 7. The heat generating resistive line 4 is supplied with a preset amount of current from the main unit of the recording apparatus. For a return path of current, a dedicated wiring may be used, or a wiring on the negative side of a power supply system may be used. When a dedicated wiring is used, the wiring itself can be used as a heat generating resistive line, and thus, the amount of heat generation can be increased. The amount of current flowing through the heat generating resistive line 4 may be fixedly set by a circuit or the like or may be variable in accordance with a situation.

According to the flexible wiring board 1 of the present embodiment, when current flows in the heat generating resistive line 4 planarly in contact with the support member, the heat generating resistive line 4 generates heat and can heat the support member. For example, the flexible wiring board 1 is provided to be in contact with a low temperature portion of the support member. For example, when the recording element is driven, the temperature of a liquid in the flow path on the discharge side becomes higher in the support member than the temperature of a liquid in the flow path on the supply side. In such a case, the low temperature portion is a side surface adjacent to the flow path on the supply side, and the flexible wiring board 1 is provided to be in contact with this side surface. The heat generating resistive line 4 is supplied with current during a drive period in which the recording element substrate is driven, and thereby the heat generating resistive line 4 heats the side surface of the support member. In such a way, it is possible to heat a low temperature portion of the support member, and it is thus possible to suppress the temperature distribution of the support member from being uneven. As a result, it is possible to suppress deformation of the support member due to a thermal stress.

In particular, since a long support member that supports a plurality of recording element substrates is likely to deform due to a synergy of a thermal stress and a stress caused by its own weight, the use of the flexible wiring board 1 of the present embodiment further increases the advantageous effect of preventing deformation of the support member. Further, deformation of the support member causes a shift of a printed image. If there is no deformation due to the temperature distribution of the support member, there can be only deformation due to the weight of the support member, and it is thus possible to measure and correct the amount of a shift of a printed image caused by the deformation of the support member.

Note that, since driving of the recording element substrate causes the recording element substrate itself to generate heat, the temperature of a portion included in the support member and supporting the recording element substrate rises. As a result, the temperature distribution of the support member may become uneven, and this may cause deformation due to a thermal stress. With use of the flexible wiring board 1 of the present embodiment, it is also possible to suppress such deformation of the support member.

Further, since the flexible wiring board 1 of the present embodiment can be implemented by embedding the heat generating resistive lines 4 in an existing flexible wiring board having signal lines and power lines, a required space for arrangement does not significantly increase compared to the existing flexible wiring board. Further, since there is no need to add a new member such as a flexible circuit disclosed in Japanese Patent No. 6514457, it is possible to suppress an increase in manufacturing cost.

Note that, although the flexible wiring board 1 illustrated in FIG. 1 is of a single-layer wiring structure, the embodiment is not limited thereto. The flexible wiring board 1 may be of a multilayer wiring structure. For example, the flexible wiring board 1 may have a first wiring layer including the heat generating resistive lines 4 and a second wiring layer including the signal lines 3 and the power lines (5, 6). Further, the flexible wiring board 1 may have a first wiring layer including the heat generating resistive lines 4, a second wiring layer including the signal lines 3, and a third wiring layer including the power lines (5, 6). In any cases, the first wiring layer is located on the support member side.

Further, the wiring form of the flexible wiring board 1 is not limited to the wiring form illustrated in FIG. 1. The wiring form of the flexible wiring board 1 can be suitably changed in accordance with the required number or the required length of heat generating resistive lines 4, a state of the temperature distribution of the support member, and the arrangement of the pads 2 and 7 or the like. Furthermore, it is preferable that the signal line 3, the heat generating resistive line 4, the power line 5, and the power line 6 be formed of a copper material (copper foil material). This can reduce the manufacturing cost of the flexible wiring board 1.

Note that turning on and off of the supply of current to the heat generating resistive lines 4 may generate no small amount of unwanted electromagnetic radiation, and electromagnetic radiation noise may affect the signal lines 3. For example, electromagnetic radiation noise may affect a drive signal or the like on the recording element substrate, and this may cause a malfunction of a drive circuit on the recording element substrate. Thus, if there is influence of electromagnetic radiation noise, it is preferable to provide a protective wiring or the like to the signal lines 3.

Second Embodiment

Figure 2:
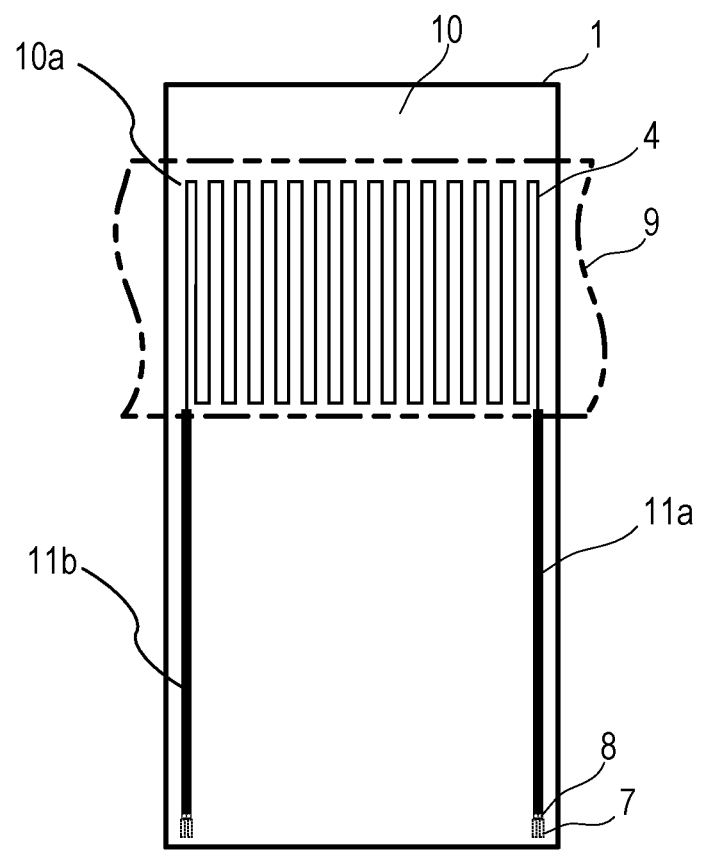
FIG. 2 is a schematic diagram illustrating a configuration of a flexible wiring board according to a second embodiment of the present disclosure.

FIG. 2 is a schematic diagram illustrating a configuration of a flexible wiring board according to a second embodiment of the present disclosure. The flexible wiring board 1 has a heat generating layer 10 including the heat generating resistive line 4, power lines 11a and 11b, and a via 8. Although not illustrated in FIG. 2, the flexible wiring board 1 also has a wiring layer including the signal lines 3 or the power lines (5, 6) described in the first embodiment. Note that, to avoid duplicated illustration, description of the features described in the first embodiment will be omitted.

The heat generating layer 10 has a contact surface 10a that is in contact with the support member 9. The heat generating resistive line 4 is arranged densely on the contact surface 10a. To enhance the heating effect, the heat generating resistive line 4 may be exposed in the contact surface 10a. One end of the heat generating resistive line 4 is electrically connected to the power line 11a, and the other end of the heat generating resistive line 4 is electrically connected to the power line 11b. The heat generating resistive line 4 is formed of a pattern having a plurality of folds (hereafter, referred to as a fold pattern). The width (or the sectional area) of each of the power lines 11a and 11b is larger than the width (or the sectional area) of the heat generating resistive line 4.

The power lines 11a and 11b are electrically connected to different pads 7, respectively. In this example, the pad 7 is provided in the wiring layer (not illustrated) including the signal lines 3. The power lines 11a and 11b are electrically connected to the pad 7 via the via 8.

According to the flexible wiring board 1 of the present embodiment, in addition to the advantageous effect described in the first embodiment, the support member 9 can be efficiently heated because the heat generating resistive line 4 is densely arranged in the contact surface 10a that is in contact with the support member 9.

Further, since the width (or the sectional area) of each of the power lines 11a and 11b is larger than the width (or the sectional area) of the heat generating resistive line 4, the amount of heat generation of the power lines 11a and 11b is sufficiently smaller than the amount of heat generation of the heat generating resistive line 4. Thus, the heat generating portion can be restricted to the contact surface 10a, and unnecessary heat generation in a region other than the contact surface 10a can be suppressed. Such suppression of unnecessary heat generation can suppress excessive power consumption.

Figure 3:
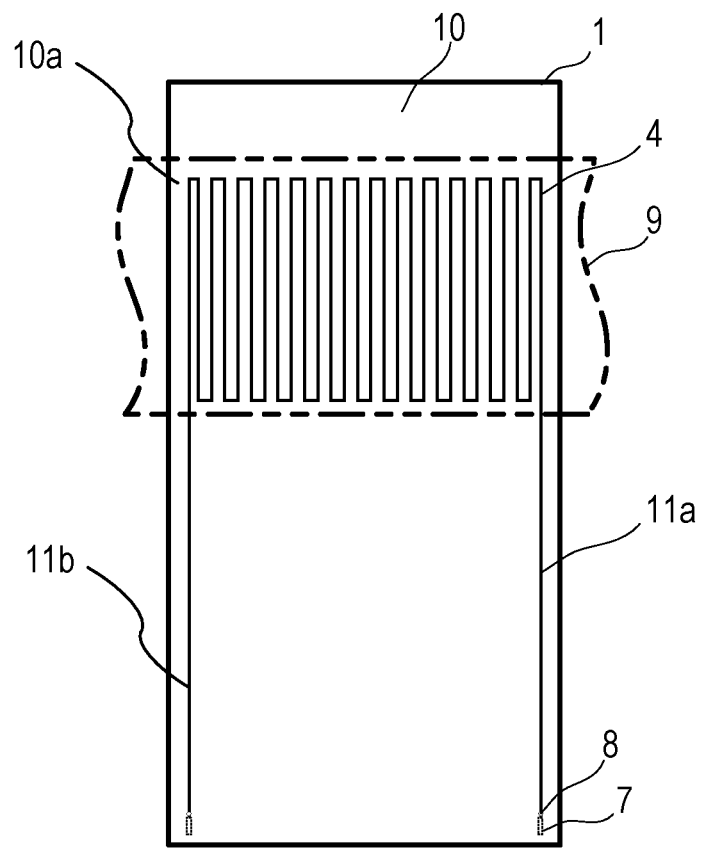
FIG. 3 is a schematic diagram illustrating a modified example of the flexible wiring board illustrated in FIG. 2.

Note that, when there is no problem if the entire flexible wiring board 1 generates heat, the width (or the sectional area) of each of the power lines 11a and 11b may be the same as the width (or the sectional area) of the heat generating resistive line 4, as illustrated in FIG. 3.

Further, the pad 7 may be provided in the heat generating layer 10. In such a case, the via 8 is unnecessary.

Note that, if there is influence of electromagnetic radiation noise when the current to the heat generating resistive line 4 is switched to be turned on and off, it is preferable to provide a protective layer that protects the signal lines 3 from the electromagnetic radiation noise. While it is effective to provide the ground side wiring to the entire protective layer, the protective layer may be used as a power supply wiring layer.

Third Embodiment

Figure 4:
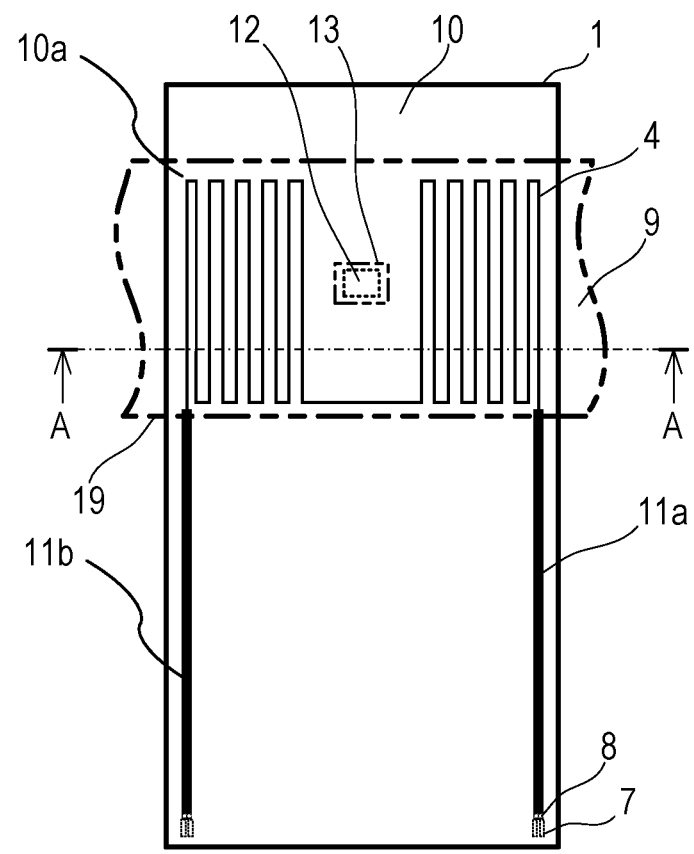
FIG. 4 is a schematic diagram illustrating a configuration of a flexible wiring board according to a third embodiment of the present disclosure.

FIG. 4 is a schematic diagram illustrating a configuration of a flexible wiring board according to a third embodiment of the present disclosure. The flexible wiring board 1 of the present embodiment has a temperature sensing element 12, which makes a difference from the second embodiment. To avoid duplicated illustration, description of the features described in the second embodiment will be omitted.

As illustrated in FIG. 4, the temperature sensing element 12 is arranged at the center part of the contact surface 10a of the heat generating layer 10. The support member 9 is provided with a recess 13 that can accommodate the temperature sensing element 12 therein. The temperature sensing element 12 is accommodated in the recess 13 with the flexible wiring board 1 being in contact with the support member 9. The temperature sensing element 12 senses the temperature of the support member 9. As the temperature sensing element 12, a temperature sensor having an integrated circuit (IC), a thermistor, a diode, or the like may be used, for example.

The heat generating resistive line 4 is arranged densely on the contact surface 10a so as to avoid the temperature sensing element 12. In this example, the heat generating resistive line 4 of the fold pattern is formed on both sides of the temperature sensing element 12. The heat generating resistive line 4 is distant from the temperature sensing element 12 by a predetermined distance so as not to interfere with temperature measurement of the support member 9 performed by the temperature sensing element 12. Note that the arrangement form of the temperature sensing element 12 and the heat generating resistive line 4 is not limited to the arrangement form illustrated in FIG. 4. For example, the heat generating resistive line 4 may be arranged so as to surround the temperature sensing element 12.

According to the flexible wiring board 1 of the present embodiment, in addition to the advantageous effects described in the first and second embodiments, the temperature sensing element 12 can measure the temperature of the support member 9. This enables temperature adjustment control for the support member 9 by using the temperature sensing element 12. For example, it is possible to maintain the support member 9 at a desired temperature by controlling the amount of current flowing in the heat generating resistive line 4 based on the output value of the temperature sensing element 12.

Note that, to accurately measure the temperature of the support member 9, a material with high thermal conductivity may be arranged between the temperature sensing element 12 and the support member 9. The material with high thermal conductivity is, for example, heat-dissipating grease (thermal conductive grease), a thermal conductive sheet, or the like. These materials are existing materials and are known to be arranged between a central processing unit (CPU), a transistor, or the like and a radiator (heat sink), for example, in the field of electronic devices.

Further, in the flexible wiring board 1 of the present embodiment, although the width (or the sectional area) of each of the power lines 11a and 11b is larger than the width (or the sectional area) of the heat generating resistive line 4, the embodiment is not limited thereto. The width (or the sectional area) of each of the power lines 11a and 11b may be the same as the width (or the sectional area) of the heat generating resistive line 4 in the same manner as in the second embodiment.

Furthermore, on the contact surface 10a, the heat generating resistive line 4 may be arranged to be unbalanced on one side so as to avoid the temperature sensing element 12. However, unbalanced arrangement of the heat generating resistive line 4 may cause partial excessive heating of the support member 9, and the temperature distribution may be uneven. In such a case, the width (or the sectional area) of the heat generating resistive line 4 of a higher temperature part is designed to be larger than the width (or the sectional area) of the heat generating resistive line 4 of the remaining part. Since the increased line width (or sectional area) reduces the amount of heat generation of the heat generating resistive line 4, the temperature difference due to the unbalanced heat generating resistive line 4 can be suppressed.

In the second and third embodiments described above, the flexible wiring board 1 has the multilayer wiring structure formed of a wiring layer including the heat generating resistive line 4 and a wiring layer including the signal lines 3 and the power lines (5, 6). Regarding the flexible wiring board 1 of the third embodiment, the multilayer wiring structure will be specifically described below.

Figure 5:
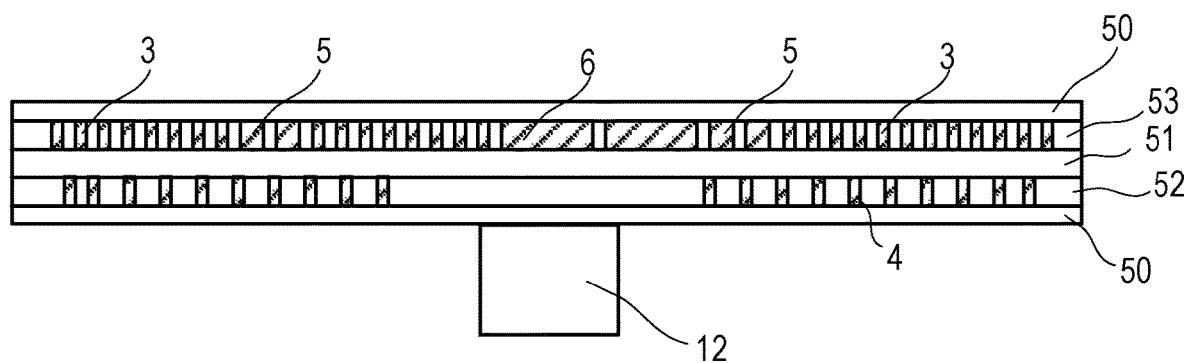
FIG. 5 is a sectional view illustrating an example of a cross section taken along a line A-A of FIG. 4.
Figure 6:
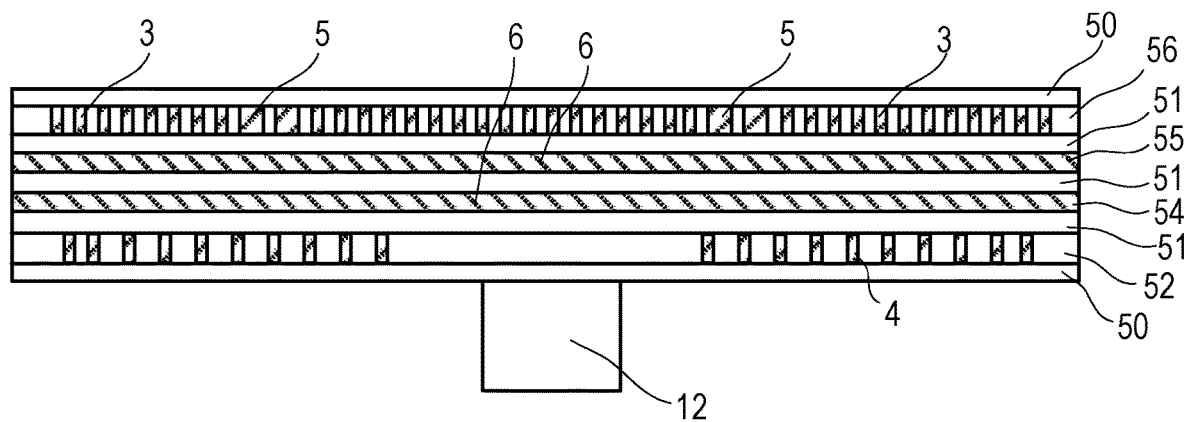
FIG. 6 is a sectional view illustrating another example of a cross section taken along a line A-A of FIG. 4.

FIG. 5 illustrates an example of the multilayer wiring structure, and FIG. 6 illustrates another example of the multilayer wiring structure. FIG. 5 and FIG. 6 both illustrate a sectional structure of the flexible wiring board 1 taken along the line A-A of FIG. 4.

Reference is made to FIG. 5, and the flexible wiring board 1 has a first wiring layer 52 and a second wiring layer 53. The first wiring layer 52 includes the heat generating resistive line 4. The second wiring layer 53 includes the signal lines 3, the power lines 5, and the power lines 6. The first wiring layer 52 is formed on one side of a base material layer 51, and the second wiring layer 53 is formed on the other side of the base material layer 51. Furthermore, two cover lay films 50 are provided so as to vertically interpose the first wiring layer 52 and the second wiring layer 53 therebetween. In this example, the cover lay film 50 is formed of a protective film layer and an adhesive agent layer, for example. The base material layer 51 is formed of polyimide or the like.

The temperature sensing element 12 is arranged on the cover lay film 50 on the first wiring layer 52 side (over the surface on the support member 9 side of the first wiring layer 52). In the first wiring layer 52, the heat generating resistive lines 4 are provided in a region other than the region adjacent to the temperature sensing element 12. In the second wiring layer 53, the power lines 6 are arranged in the center part, and the signal lines 3 and the power lines 5 are arranged on both sides of the power lines 6. Note that the second wiring layer 53 may be divided into a wiring layer including the signal lines 3 and a wiring layer including the power lines 5 and the power lines 6.

Reference is made to FIG. 6, and the flexible wiring board 1 has a first wiring layer 52, a second wiring layer 54, a third wiring layer 55, and a fourth wiring layer 56. The first wiring layer 52 includes the heat generating resistive line 4. The second wiring layer 54 and the third wiring layer 55 include the power lines 6, respectively. The fourth wiring layer 56 includes the signal lines 3 and the power lines 5.

The first base material layer 51 is arranged between the second wiring layer 54 and the third wiring layer 55. The first wiring layer 52 is arranged on the second wiring layer 54 side, and the second base material layer 51 is arranged between the first wiring layer 52 and the second wiring layer 54. The fourth wiring layer 56 is arranged on the third wiring layer 55 side, and the third base material layer 51 is arranged between the fourth wiring layer 56 and the third wiring layer 55. Two cover lay films 50 are provided so as to vertically interpose the first wiring layer 52 and the fourth wiring layer 56 therebetween. The first base material layer 51 at the center may be an adhesive layer.

The temperature sensing element 12 is arranged on the cover lay film 50 on the first wiring layer 52 side (over the surface of the first wiring layer 52 on the opposite side from the third wiring layer 55). In the first wiring layer 52, the heat generating resistive lines 4 are provided in a region other than the region adjacent to the temperature sensing element 12. In the second wiring layer 54 and the third wiring layer 55, the power lines 6 are formed over the entire layer without a gap. The first wiring layer 52 including the heat generating resistive lines 4 and the fourth wiring layer 56 including the signal lines 3 are spaced apart from each other by a wiring layer in which the power lines 6 are formed in the entire layer.

If the influence of electromagnetic radiation noise is small, it is preferable to use the flexible wiring board 1 having the two-layer wiring structure illustrated in FIG. 5. If the influence of electromagnetic radiation noise is large, it is preferable to use the flexible wiring board 1 having the four-layer wiring structure illustrated in FIG. 6. In such a case, the second wiring layer 54 and the third wiring layer 55 function as layers that protect the signal lines 3 from electromagnetic radiation noise. Note that both of the two-layer wiring structure illustrated in FIG. 5 and the four-layer wiring structure illustrated in FIG. 6 are applicable to the flexible wiring board 1 of the second embodiment.

In the flexible wiring board 1 of the present embodiment described above, the temperature sensing element 12 and the heat generating resistive line 4 may be arranged in any manner as long as it is possible to accurately sense the temperature of the support member 9 and suppress the temperature distribution of the support member from being uneven. Modified examples having different wiring forms of the heat generating resistive line will be described below.

First Modified Example

Figure 7:
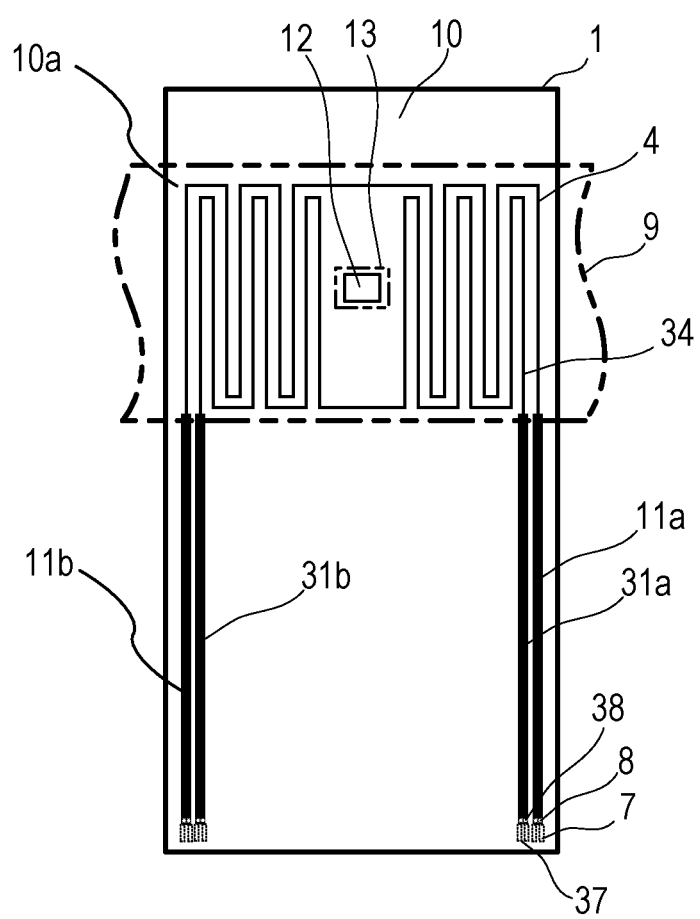
FIG. 7 is a schematic diagram illustrating a first modified example of the flexible wiring board of the third embodiment of the present disclosure.

FIG. 7 is a schematic diagram illustrating a first modified example of the flexible wiring board 1 of the third embodiment.

The flexible wiring board 1 illustrated in FIG. 7 has a heat generating resistive line 34 in addition to the heat generating resistive line 4, which makes a difference from that illustrated in FIG. 4. The heat generating resistive line 34 is arranged on the contact surface 10a in parallel to the heat generating resistive line 4 so as to avoid the temperature sensing element 12. The heat generating resistive line 34 also has a fold pattern in the same manner as the heat generating resistive line 4. The width (or the sectional area) of the heat generating resistive line 34 is the same as the width (or the sectional area) of the heat generating resistive line 4.

One end of the heat generating resistive line 34 is electrically connected to a power line 31a, and the other end of the heat generating resistive line 34 is electrically connected to a power line 31b. The power lines 31a and 31b are electrically connected to the main unit of the recording apparatus via different pads 37, respectively. The width (or the sectional area) of each of the power lines 31a and 31b is the same as the width (or the sectional area) of each of the power lines 11a and 11b. In this example, since the pads 37 are also provided in a wiring layer (not illustrated) including the signal lines 3 in the same manner as the pads 7, the power lines 31a and 31b are electrically connected to the pads 37 via vias 38.

According to the flexible wiring board 1 of the present modified example, the support member can be heated by the two heat generating resistive lines 4 and 34. Since the ratio occupied by the heat generating resistive lines on the contact surface 10a is larger than in the case illustrated in FIG. 4, the amount of heat generation on the entire contact surface 10a increases, and the support member can be evenly heated.

Further, the heat generating resistive line 4 and the heat generating resistive line 34 can be separately supplied with power. When the directions of the current flowing in the heat generating resistive line 4 and the heat generating resistive line 34 are set opposite to each other, the electromagnetic field generated by the heat generating resistive line 4 and the electromagnetic field generated by the heat generating resistive line 34 are cancelled by each other, and as a result, unwanted electromagnetic radiation can be suppressed.

Second Modified Example

Figure 8:
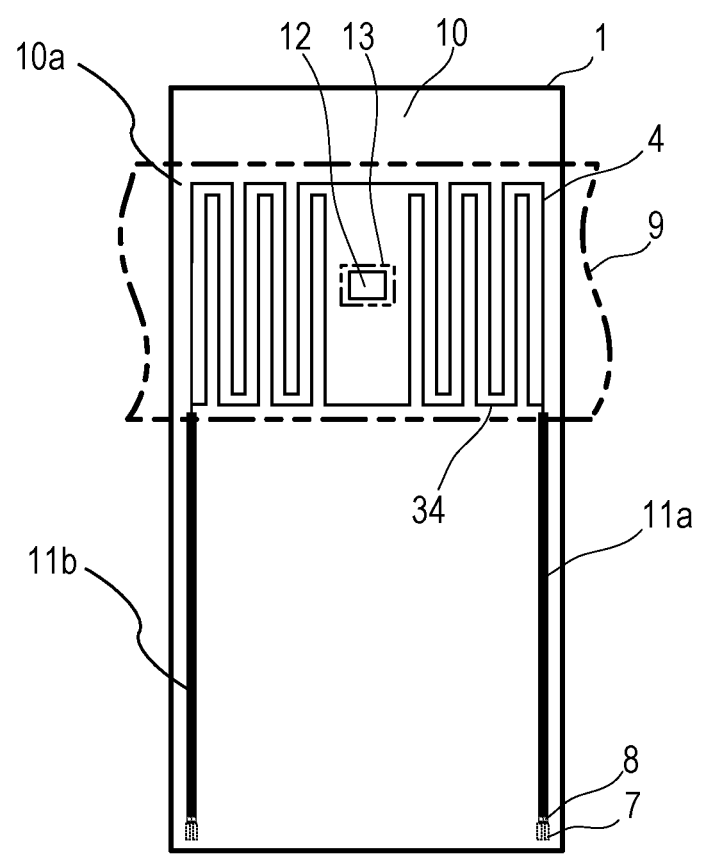
FIG. 8 is a schematic diagram illustrating a second modified example of the flexible wiring board of the third embodiment of the present disclosure.

FIG. 8 is a schematic diagram illustrating a second modified example of the flexible wiring board 1 of the third embodiment.

The flexible wiring board 1 illustrated in FIG. 8 differs from the first modified example in that the heat generating resistive line 4 and the heat generating resistive line 34 are connected in parallel. One end of each of the heat generating resistive lines 4 and 34 is electrically connected to a power line 11a, and the other of each of the heat generating resistive lines 4 and 34 is electrically connected to a power line 11b. The power lines 11a and 11b can be supplied with power that can increase the temperature of each of the heat generating resistive lines 4 and 34 to a desired temperature.

According to the flexible wiring board 1 of the present modified example, since the power lines 31a and 31b, the pad 37, and the via 38 are unnecessary, the manufacturing cost can be reduced compared to the first modified example.

Third Modified Example

Figure 9:
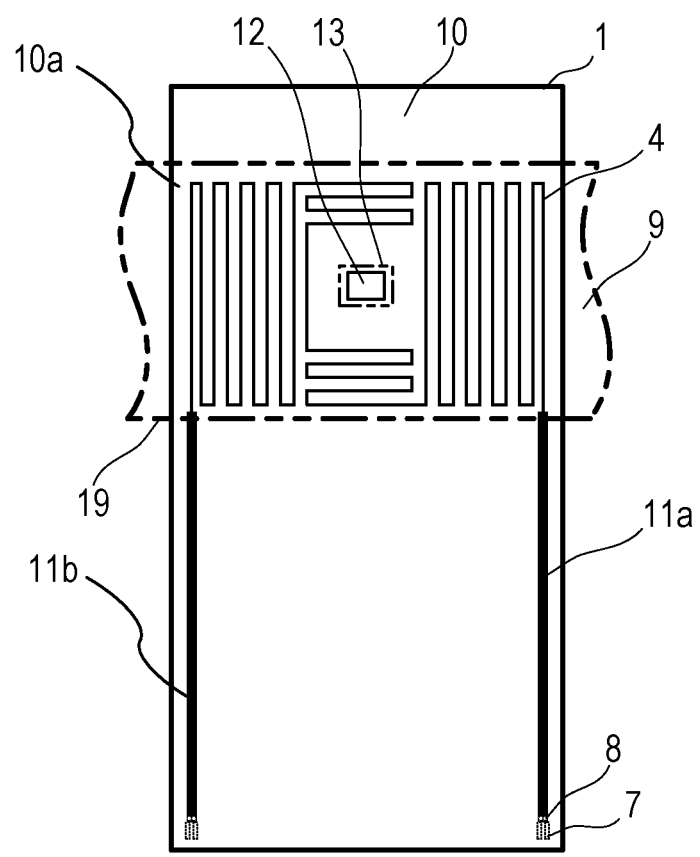
FIG. 9 is a schematic diagram illustrating a third modified example of the flexible wiring board of the third embodiment of the present disclosure.

FIG. 9 is a schematic diagram illustrating a third modified example of the flexible wiring board 1 of the third embodiment.

The flexible wiring board 1 illustrated in FIG. 9 differs from that illustrated in FIG. 4 in that the heat generating resistive line 4 of the fold pattern is arranged at the upper, lower, left, and right of the temperature sensing element 12.

According to the flexible wiring board 1 of the present modified example, compared to that illustrated in FIG. 4, the increased ratio occupied by the heat generating resistive line 4 on the contact surface 10a increases the amount of heat generation on the entire contact surface 10a, and the support member can be evenly heated.

Fourth Modified Example

Figure 10:
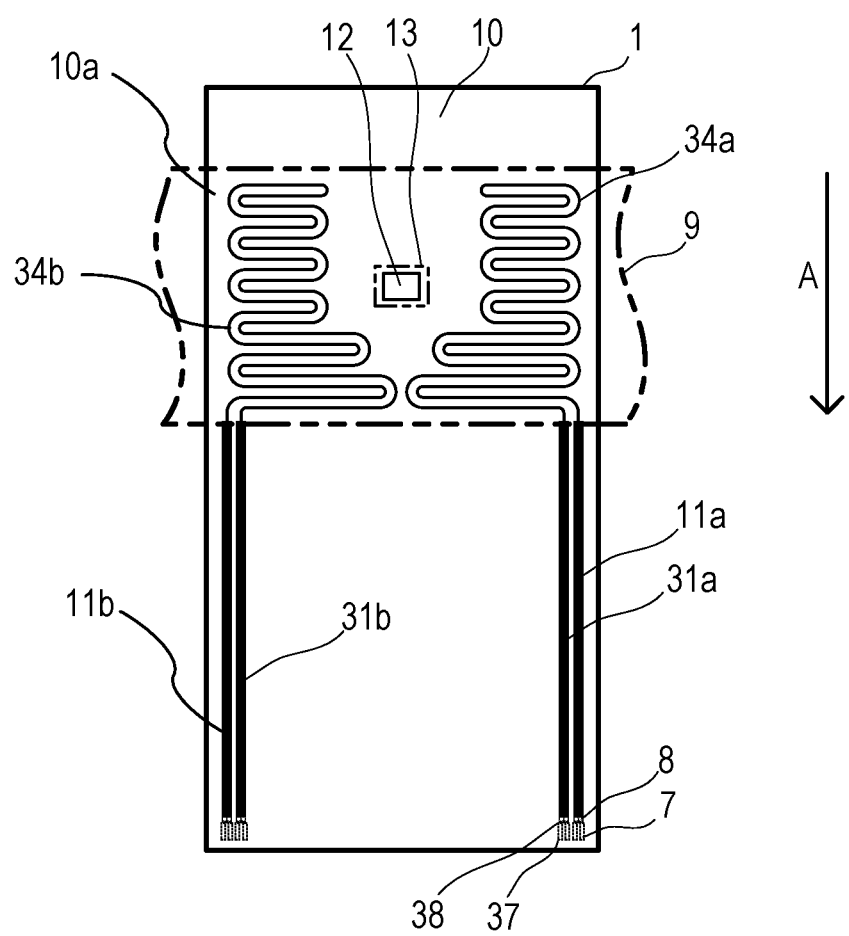
FIG. 10 is a schematic diagram illustrating a fourth modified example of the flexible wiring board of the third embodiment of the present disclosure.

FIG. 10 is a schematic diagram illustrating a fourth modified example of the flexible wiring board 1 of the third embodiment.

The flexible wiring board 1 illustrated in FIG. 10 includes two heat generating resistive lines 34a and 34b that can be separately supplied with power in the same manner as in the first modified example. However, the shape and the length of the wiring pattern of the heat generating resistive lines 34a and 34b differ from those of the first modified example.

One end of the heat generating resistive line 34a is electrically connected to the power line 11a, and the other end of the heat generating resistive line 34a is electrically connected to the power line 31a. The power line 11a is electrically connected to the pad 7 via the via 8, and the power line 31a is electrically connected to the pad 37 via the via 38. The width (or the sectional area) of each of the power lines 11a and 31a is larger than the width (or the sectional area) of the heat generating resistive line 34a. The heat generating resistive line 34a is also electrically connected to the power lines 11b and 31b in the same manner as the heat generating resistive line 34a. The power lines 11b and 31b are electrically connected to the pads 7 and 37 via the vias 8 and 38. The width (or the sectional area) of each of the power lines 11b and 31b is larger than the width (or the sectional area) of the heat generating resistive line 34b.

The heat generating resistive lines 34a and 34b are arranged so as to interpose the temperature sensing element 12 from both sides. While both the heat generating resistive lines 34a and 34b have a fold pattern, the folding sections are formed in a curved manner. The fold length L is longer on the power line (11a, 11b, 31a, 31b) side. In the contact surface 10a, the amount of heat generation in a region having a longer fold length L is larger than the amount of heat generation in a region having a shorter fold length L.

In the present modified example, the side surface of the holding member 9 in contact with the contact surface 10a has a temperature distribution in the direction of the arrow A. Specifically, the temperature of the side surface of the holding member 9 is lower on the power line (11a, 11b, 31a, 31b) side. In contrast, the amount of heat generation on the contact surface 10a is larger on the power line (11a, 11b, 31a, 31b) side. Thus, the lower temperature region of the side surface of the holding member 9 is heated in the region of the contact surface 10a having the larger amount of heat generation, and the higher temperature region of the side surface of the holding member 9 is heated in the region of the contact surface 10a having the smaller amount of heat generation. This makes it possible to suppress the temperature on the side surface of the holding member 9 from being uneven.

Further, the heat generating resistive lines 34a and 34b can be separately supplied with power in the same manner as in the first modified example. When the directions of the current flowing in the heat generating resistive lines 34a and 34*b* are set opposite to each other, the electromagnetic field generated by the heat generating resistive line 34*a* and the electromagnetic field generated by the heat generating resistive line 34*b* are cancelled by each other, and as a result, unwanted electromagnetic radiation can be suppressed.

Furthermore, the folding sections of the heat generating resistive lines 34*a* and 34*b* are formed in a curved manner, and thereby unwanted electromagnetic radiation can be further suppressed. For example, when switching of turning on and off of the current is performed at a high rate, unwanted electromagnetic radiation due to disturbance or the like of current occurring at the folding section of the heat generating resistive line 4 can be suppressed. Note that the folding section of the heat generating resistive lines 34*a* and 34*b* is not limited to a curved wiring. For example, the folding section of the heat generating resistive lines 34*a* and 34*b* may be wired linearly with angles so as not to form any acute angle. In such a case, the angle formed between two wirings forming an angle is preferably 135 degrees or larger, for example.

Further, a configuration other than the modified examples described above can be applied. For example, the signal lines, the heat generating resistive lines, and the power lines may be formed in the same wiring layer, and the power line may be arranged between the signal line and the heat generating resistive line, and the temperature sensing element 12 may be arranged over a region of the signal lines of the wiring layer. According to such a configuration, it is possible to suppress influence of unwanted electromagnetic radiation noise, accurately determine the temperature of the support member 9, and thus suppress the temperature on the side surface of the holding member 9 from being uneven.

Next, a liquid ejection head to which the flexible wiring board 1 of the present disclosure is applied will be described.

Figure 11:
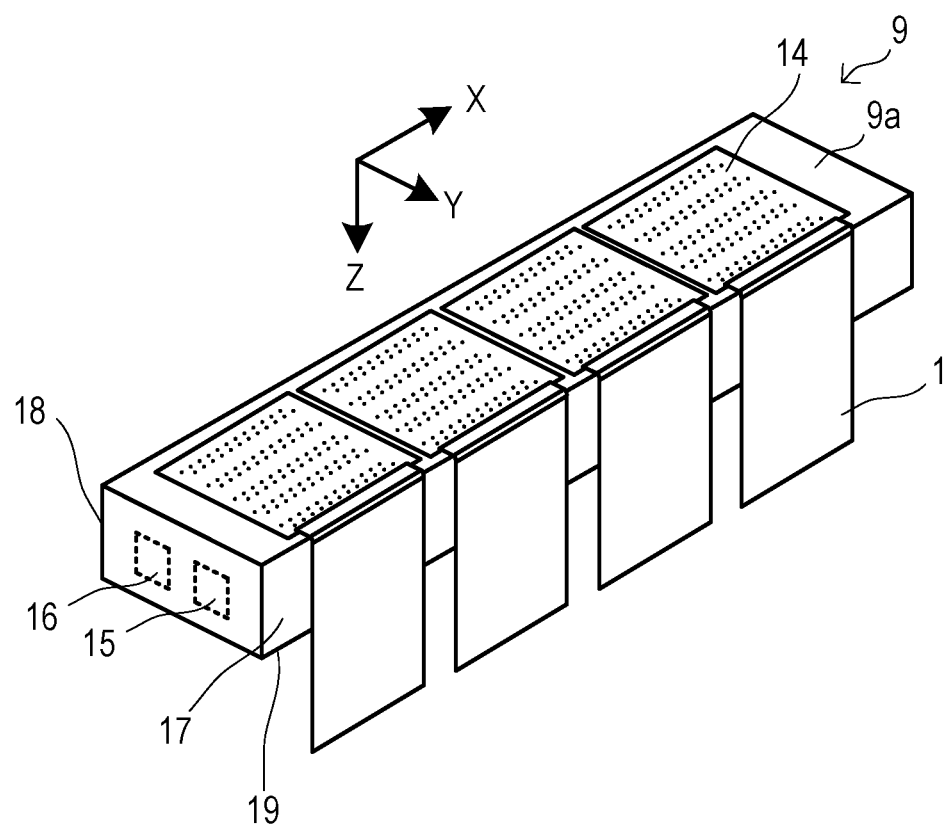
FIG. 11 is a schematic diagram illustrating an example of a liquid ejection head of the present disclosure.

FIG. 11 is a schematic diagram illustrating an example of a liquid ejection head. The liquid ejection head illustrated in FIG. 11 has four recording element substrates 14, four flexible wiring boards 1, and a long support member 9. The support member 9 is a rectangular parallelepiped and has a support surface 9*a* that supports the recording element substrates 14. In FIG. 11, the longer side direction of the support surface 9*a* is defined as an X-axis direction, and the shorter side direction of the support surface 9*a* is defined as a Y-axis direction. The height direction (thickness direction) of the support member 9 is defined as a Z-axis direction.

The four recording element substrates 14 are aligned in a line in the X-axis direction and arranged on the support surface 9*a* of the support member 9. The support member 9 has a flow path 15 used for supplying a liquid such as ink to the recording element substrates 14 and a flow path 16 used for discharging a liquid that has passed through the inside of the recording element substrates 14.

Both the flow path 15 on the supply side and the flow path 16 on the discharge side extend in the X-axis direction. The liquid is supplied to each recording element substrate 14 via the flow path 15. The liquid that has passed through the inside of each recording element substrate 14 is discharged via the flow path 16.

Each flexible wiring board 1 is any of those in the first to third embodiments described above and is provided to each recording element substrate 14. One end (the end on the pad 2 side) of the flexible wiring board 1 is fixed to the support surface 9*a* of the support member 9 together with the recording element substrate 14, and the pad 2 is electrically connected to the recording element substrate 14. The flexible wiring board 1 is bent at the edge on the longer-side side of the support surface 9*a* and comes into contact with the side surface 17 of the support member 9. The side surface 17 is adjacent to the flow path 15 on the liquid supply side.

In the support member 9, since a liquid is heated inside the recording element substrates 14, the temperature of the liquid flowing in the flow path 16 on the discharge side is higher than the temperature of the liquid flowing in the flow path 15 on the supply side. Thus, a temperature difference occurs between a portion including the flow path 16 and a portion including the flow path 15, and the temperature distribution in the Y-axis direction becomes uneven. As a result, the support member 9 may deform due to a thermal stress. For example, warping relative to the X-axis direction occurs.

According to the liquid ejection head illustrated in FIG. 11, it is possible to heat the side surface 17 that is a low temperature portion of the support member 9 by using the flexible wiring board 1. It is thus possible to suppress the temperature distribution of the support member 9 from being uneven and suppress deformation due to a thermal stress.

With the use of the flexible wiring board 1 of the third embodiment, it is possible to measure the temperature of the side surface 17 of the support member 9 by using the temperature sensing element 12. By adjusting the amount of current flowing in the heat generating resistive line 4 based on the temperature measured by the temperature sensing element 12, it is possible to further reduce the temperature difference between a portion including the flow path 16 and a portion including the flow path 15. Thus, warping in the X-axis direction can be effectively suppressed.

Note that the recording element substrate 14 may generate heat by itself, and the temperature distribution of the support member 9 may be uneven. For example, for the purpose of providing high quality printing, a heat generating resistor called sub-heater is provided inside the recording element substrate 14, and the heat generating resistor is used to perform temperature adjustment control to evenly heat the entire recording element substrate 14. In such a case, since the temperature of the recording element substrate 14 is higher than the temperature of a liquid supplied to the flow path 15 or 16, a temperature distribution in the Z-axis direction occurs in the support member 9. Specifically, the temperature of the support surface 9*a* becomes higher than the temperature of the side surface 19 on the opposite side from the support surface 9*a*. The flexible wiring board 1 is used to heat the side surface 17 of the support member 9 so that the temperature of the support member 9 becomes the same as the temperature of the recording element substrate 14. This makes it possible to suppress the temperature distribution in the Z-axis direction from being uneven and suppress warping of the support member 9 in the Z-axis direction.

Figure 12:
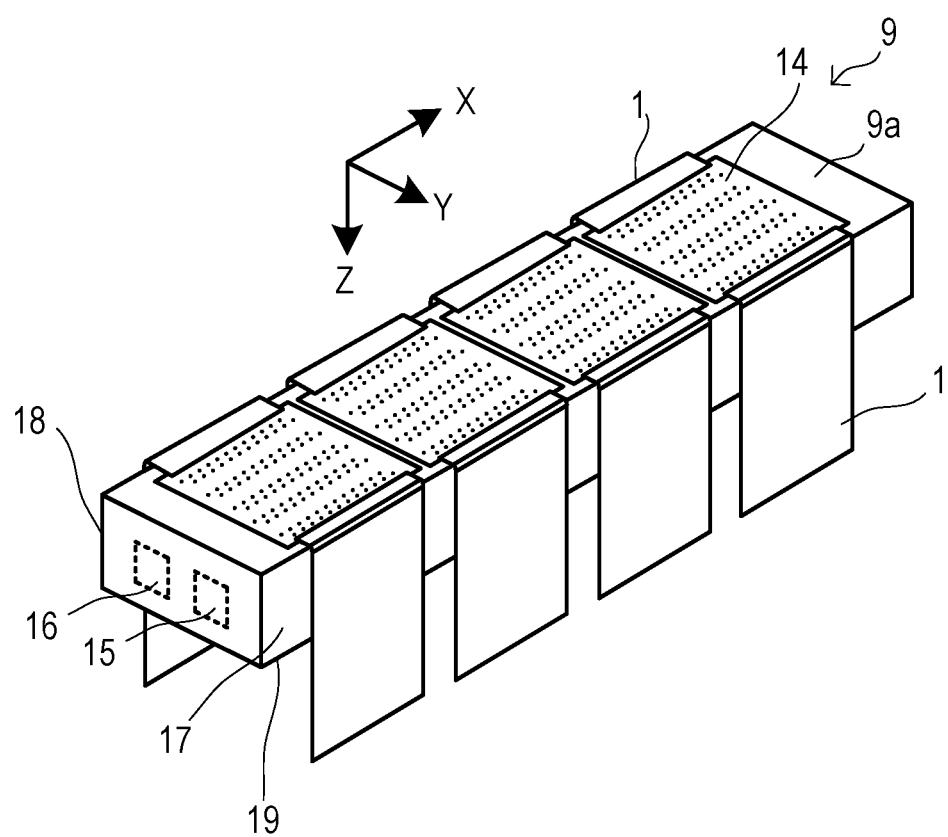
FIG. 12 is a schematic diagram illustrating another example of a liquid ejection head of the present disclosure.

FIG. 12 is a schematic diagram illustrating another example of the liquid ejection head. The liquid ejection head illustrated in FIG. 12 differs from that illustrated in FIG. 11 in that the flexible wiring board 1 is in contact with both sides of the support member 9, that is, the side surface 17 and a side surface 18.

According to the liquid ejection head illustrated in FIG. 12, the flexible wiring board 1 can be used to heat not only the side surface 17 but also the side surface 18 on the opposite side from the side surface 17. It is therefore possible to efficiently heat the support member 9 by using the flexible wiring board 1 so that the temperature of the support member 9 and the temperature of the recording element substrate 14 become the same, for example.

Next, a temperature adjustment apparatus for a liquid ejection head will be described.

Figure 13:
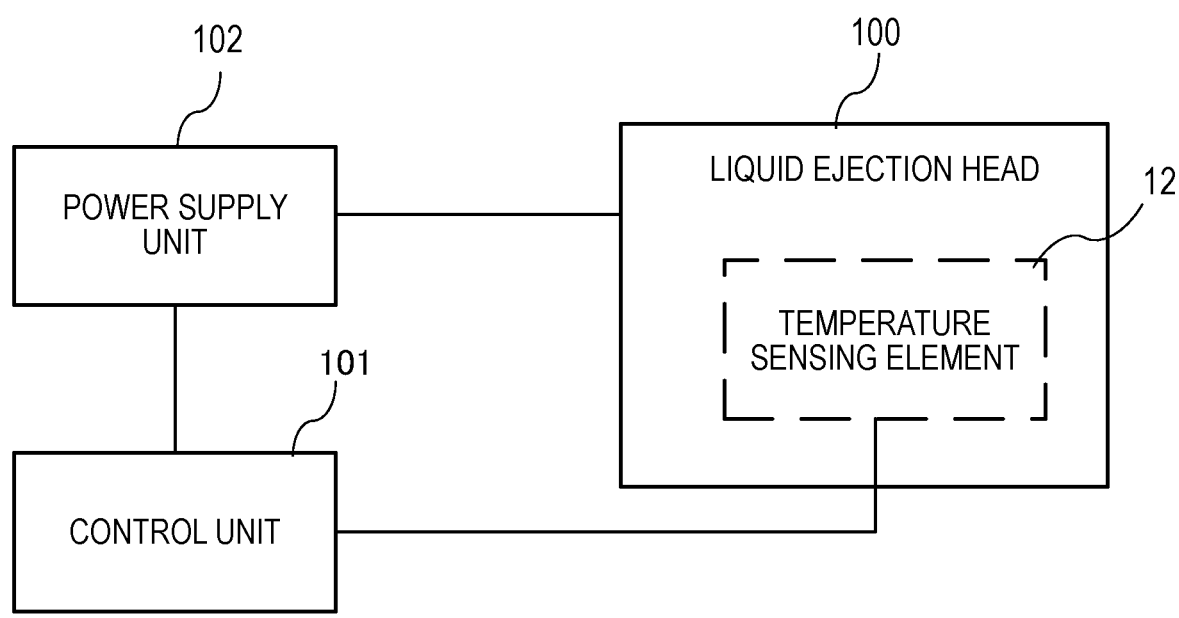
FIG. 13 is a block diagram illustrating a general configuration of a temperature adjustment apparatus of the present disclosure.

FIG. 13 is a block diagram illustrating a general configuration of a temperature adjustment apparatus. The temperature adjustment apparatus illustrated in FIG. 13 is to performs temperature adjustment control of a liquid ejection head 100 and has a control unit 101 and a power supply unit 102. The liquid ejection head 100 is a liquid ejection head having the flexible wiring board 1 of the present disclosure and illustrated in FIG. 11 or FIG. 12, for example. The power supply unit 102 supplies power to the liquid ejection head 100. For example, the power supply unit 102 supplies the flexible wiring board 1 with drive power used for driving the recording element substrates 14 or power used for causing the heat generating resistive lines 4 to generate heat.

The control unit 101 controls the power supply operation of the power supply unit 102. For example, the control unit 101 supplies power from the power supply unit 102 to the heat generating resistive line 4 during a drive period in which the recording element substrates 14 are driven.

Note that, when the liquid ejection head 100 has the flexible wiring board 1 of the third embodiment, the control unit 101 acquires an output value of the temperature sensing element 12 (a measured value of the temperature of the support member 9). The control unit 101 adjusts the amount of current flowing in the heat generating resistive line 4 based on the output value of the temperature sensing element 12 so that the support member 9 is at a predetermined temperature.

As a scheme of current control to the heat generating resistive line 4, a current chopper scheme or a current regulation scheme is applicable.

The current chopper scheme is a scheme to set a current conduction period and a non-current conduction period alternatingly to control the current flowing in the heat generating resistive line 4. The current chopper scheme may be, for example, a pulse width modulation (PWM) scheme or a pulse frequency modulation (PFM) scheme. The pulse width modulation scheme is a scheme to switch the ratio (duty) of the on-period and the off-period by adjusting the pulse width with a constant switching frequency of turning on and off of the current. The pulse frequency modulation scheme is a scheme to adjust the frequency with a constant pulse width, specifically, adjust the off-period with a constant on-period.

The current regulation scheme is a scheme to adjust the current flowing in the heat generating resistive line 4 by changing the voltage to be applied to the heat generating resistive line 4. The current regulation scheme may be, for example, a scheme to adjust the on-resistance by controlling the base current of a transistor to change the current flowing in the heat generating resistive line 4.

It is preferable to apply a suitable scheme of current control to the heat generating resistive line 4 in accordance with a use environment of the liquid ejection head 100 or a difference between the current temperature and a target temperature of the support member 9 or the like. Herein, the current temperature of the support member 9 can be obtained from the output value of the temperature sensing element 12.

For example, the control unit 101 may supply power to the heat generating resistive line 4 by the pulse width modulation scheme when the support member 9 has a low thermal capacity and is easily heated and cooled. Further, for example, the control unit 101 may supply power to the heat generating resistive line 4 by the pulse frequency modulation scheme when the support member 9 has a high thermal capacity and is not easily heated or cooled. This power supply by the pulse frequency modulation scheme is effective when it is sufficient that the amount of heat is provided in a way as with an intermittent operation. In general, since a longer cycle makes it difficult to finely adjust the duty ratio in the pulse width modulation scheme, it is preferable to use the pulse frequency modulation scheme if a longer cycle is needed.

Further, the control unit 101 may selectively switch the pulse width modulation scheme and the pulse frequency modulation scheme based on a difference between the current temperature and a target temperature of the support member 9. For example, the control unit 101 selects the pulse width modulation scheme when the difference between the current temperature and the target temperature of the support member 9 is greater than a threshold T and selects the pulse frequency modulation scheme when the difference between the current temperature and the target temperature of the support member 9 is less than or equal to the threshold T.

For example, when the current temperature is lower than the target temperature (for example, the difference is 20 degrees Celsius) and it is intended to increase the temperature close to the target temperature as soon as possible, the pulse width modulation scheme is selected. When the difference between the current temperature and the target temperature is small (for example, several degrees Celsius) and there is a likelihood of exceeding the target temperature with the pulse width modulation scheme, the pulse frequency modulation scheme is selected. In such a case, the threshold T is set to several degrees Celsius.

Furthermore, the control unit 101 may supply power to the heat generating resistive line 4 by the current regulation scheme. For example, when analog information from a sensor or the like via the signal line 3 or the like is acquired, the current regulation scheme is selected. When the pulse width modulation scheme or the pulse frequency modulation scheme is used, unwanted electromagnetic radiation may occur due to the pulse current, and the drive circuit on the recording element substrate may malfunction. The use of the current regulation scheme can suppress such unwanted electromagnetic radiation.

Furthermore, the control unit 101 may supply power to the heat generating resistive line 4 by performing switching to select any one of the pulse width modulation scheme, the pulse frequency modulation scheme, and the current regulation scheme based on a difference between the current temperature (an output value of the temperature sensing element 12) and a target temperature. Accordingly, the support member 9 can be efficiently and reliably heated to the target temperature.

Furthermore, the control unit 101 may combine the current regulation scheme and any one of the pulse width modulation scheme and the pulse frequency modulation scheme to supply power to the heat generating resistive line 4.

When the pulse width modulation scheme and the current regulation scheme are combined, the pulse width modulation scheme is applied to control the current ranging from 10 to 100 percent of the maximum current, and the current regulation scheme is applied to control the current less than 10 percent, for example. Further, the pulse width modulation scheme and the current regulation scheme may be combined to finely adjust the current greater than or equal to 10 percent of the maximum current.

When the pulse frequency modulation scheme and the current regulation scheme are combined, the pulse frequency modulation scheme may be applied to control the current less than or equal to 50 percent the maximum current, and the current regulation scheme may be applied to control the current exceeding 50 percent, for example.

As described above, by combining the pulse width modulation scheme or the pulse frequency modulation scheme with the current regulation scheme, it is possible to control a range of current which is unable to be controlled by only the pulse width modulation scheme or the pulse frequency modulation scheme. Further, when an analog signal from a sensor or the like is handled, since unwanted electromagnetic radiation due to pulse current can be suppressed by temporary switching to the current regulation scheme, analog signals with less noise can be obtained.

According to the present disclosure, it is possible to suppress an uneven temperature distribution of the support member without adding a new member that requires a space for arrangement.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-044421, filed Mar. 18, 2021, which is hereby incorporated by reference herein in its entirety.

What is claimed is:

1. An electric wiring member supported by a support member that supports a recording element substrate configured to eject a liquid, the electric wiring member comprising:
    a signal line configured to transmit a drive signal used for driving the recording element substrate;
    a power line configured to supply drive power to the recording element substrate; and
    at least one heat generating resistive line configured to heat the support member,
    wherein the power line is arranged between the signal line and the heat generating resistive line.

2. The electric wiring member according to claim 1, wherein a plurality of heat generating resistive lines are arranged in parallel in a width direction of the electric wiring member.

3. The electric wiring member according to claim 1, further comprising:
    a first wiring layer including the heat generating resistive line; and
    a second wiring layer including the signal line and the power line.

4. The electric wiring member according to claim 1, further comprising:
    a first wiring layer including the heat generating resistive line;
    a second wiring layer including the signal line; and
    a third wiring layer including the power line.

5. The electric wiring member according to claim 4, wherein the third wiring layer is arranged between the first wiring layer and the second wiring layer.

6. The electric wiring member according to claim 3, wherein the first wiring layer is arranged on a side in contact with the support member.

7. The electric wiring member according to claim 1, further comprising a contact surface in contact with the support member, wherein the heat generating resistive line is formed on the contact surface.

8. The electric wiring member according to claim 7, wherein the heat generating resistive line is exposed in the contact surface.

9. The electric wiring member according to claim 7, further comprising a temperature sensing element provided on the contact surface.

10. The electric wiring member according to claim 9, wherein the heat generating resistive line is arranged away from the temperature sensing element by a predetermined distance.

11. The electric wiring member according to claim 10, wherein the heat generating resistive line is arranged on both sides of the temperature sensing element.

12. The electric wiring member according to claim 10, wherein the heat generating resistive line is arranged so as to surround the temperature sensing element.

13. The electric wiring member according to claim 9, wherein the temperature sensing element is accommodated in a recess of the support member.

14. The electric wiring member according to claim 1, further comprising a temperature sensing element that senses a temperature of the support member.

15. The electric wiring member according to claim 14,
    wherein the signal line, the heat generating resistive line, and the power line are formed in the same wiring layer, and
    wherein the power line is arranged between the signal line and the heat generating resistive line, and the temperature sensing element is arranged over a region of the signal line of the wiring layer.

16. The electric wiring member according to claim 14, further comprising:
    a first wiring layer including the heat generating resistive line; and
    a second wiring layer including the signal line and the power line,
    wherein the first wiring layer is arranged on a side in contact with the support member, the temperature sensing element is arranged over a surface of the first wiring layer, and the surface is on the support member side.

17. The electric wiring member according to claim 14, further comprising:
    a first wiring layer including the heat generating resistive line;
    a second wiring layer including the signal line; and
    a third wiring layer including the power line,
    wherein the first wiring layer is arranged on a side in contact with the support member, the third wiring layer is arranged between the first wiring layer and the second wiring layer, the temperature sensing element is arranged over a surface of the first wiring layer, and the surface is on the opposite side from the third wiring layer.

18. The electric wiring member according to claim 1, wherein the heat generating resistive line, the signal line, and the power line are formed of copper.

19. A liquid ejection head configured to eject a liquid, the liquid ejection head comprising:
    an electric wiring member;
    a recording element substrate electrically connected to the electric wiring member and configured to eject the liquid; and
    a support member that supports the recording element substrate,
    wherein the electric wiring member includes:
        a signal line configured to transmit a drive signal used for driving the recording element substrate,
        a power line configured to supply drive power to the recording element substrate, and a heat generating resistive line configured to heat the support member, wherein the power line is arranged between the signal line and the heat generating resistive line, and wherein the electric wiring member is supported by the support member.

20. The liquid ejection head according to claim 19, wherein the support member includes:

a first flow path for supplying the liquid to the recording element substrate, and a second flow path for discharging the liquid that passed through the recording element substrate, and wherein the electric wiring member is in contact with a side surface of the support member, and the side surface is on the first flow path side.

* * * * *